(12) United States Patent
Tian et al.

(10) Patent No.: US 12,142,612 B2
(45) Date of Patent: Nov. 12, 2024

(54) DISPLAY PANEL AND DISPLAY DEVICE

(71) Applicants: Beijing BOE Display Technology Co., Ltd., Beijing (CN); BOE Technology Group Co., Ltd., Beijing (CN)

(72) Inventors: Chunguang Tian, Beijing (CN); Li Tian, Beijing (CN); Cuicui Zheng, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 383 days.

(21) Appl. No.: 17/597,882

(22) PCT Filed: Apr. 20, 2021

(86) PCT No.: PCT/CN2021/088538
§ 371 (c)(1),
(2) Date: Jan. 27, 2022

(87) PCT Pub. No.: WO2021/223592
PCT Pub. Date: Nov. 11, 2021

(65) Prior Publication Data
US 2022/0262823 A1      Aug. 18, 2022

(30) Foreign Application Priority Data
May 6, 2020   (CN) .......................... 202010372676.9

(51) Int. Cl.
*H01L 27/12*       (2006.01)
(52) U.S. Cl.
CPC .............................. *H01L 27/124* (2013.01)

(58) Field of Classification Search
CPC ................................ H01L 27/124; G09F 9/30
See application file for complete search history.

(56) References Cited

U.S. PATENT DOCUMENTS

| 2009/0033825 A1 | 2/2009 | Fukayama et al. |
| 2011/0164196 A1 | 7/2011 | Fukayama et al. |

FOREIGN PATENT DOCUMENTS

| CN | 104536211 A | 4/2015 |
| CN | 204289448 U | 4/2015 |

(Continued)

OTHER PUBLICATIONS

English Machine Translation of CN 108 153 070, Liet al (Year: 2024).*

(Continued)

*Primary Examiner* — Donald L Raleigh
(74) *Attorney, Agent, or Firm* — Workman Nydegger

(57) ABSTRACT

A display panel includes an opposing substrate and a display substrate. At least one side of the display substrate has a pad area in which gold fingers are arranged. The orthographic projection of the opposing substrate on the display substrate covers the pad area. In a non-display area of the display panel, the opposing substrate and the display substrate are bonded by means of frame sealant. The pad area is located on the outer side of the frame sealant. Side surfaces of the gold fingers are exposed from the side surface of the display substrate. A conductive layer is formed on the side surfaces of the gold fingers. The display panel further includes a flexible buffer layer which is filled between the opposing substrate and the display substrate and covers the gold fingers. The flexible buffer layer is located on the outer side of the frame sealant.

20 Claims, 3 Drawing Sheets

(56) References Cited

FOREIGN PATENT DOCUMENTS

| CN | 104834143 | A | | 8/2015 | | |
|----|-----------|---|---|--------|---|---|
| CN | 105137636 | A | | 12/2015 | | |
| CN | 106444183 | A | | 2/2017 | | |
| CN | 106462018 | A | * | 2/2017 | ........... | G02F 1/1309 |
| CN | 106711160 | A | | 5/2017 | | |
| CN | 106848087 | A | | 6/2017 | | |
| CN | 108153070 | A | * | 6/2018 | ........... | G02F 1/1333 |
| CN | 209373284 | U | | 9/2019 | | |
| CN | 110989259 | A | | 4/2020 | | |
| CN | 111445801 | A | | 7/2020 | | |

OTHER PUBLICATIONS

English Machine Translation of CN 106 462 018, Jiang et al (Year: 2024).*
Chinese Office Action, mailed Jun. 22, 2021, from CN202010372676.9.
Chinese Office Action, mailed Dec. 14, 2021, from CN202010372676.9.
Chinese Office Action, mailed Mar. 29, 2022, from CN202010372676.9.
International Search Report, mailed Jun. 28, 2021, from PCT/CN2021/088538.

* cited by examiner

DISPLAY PANEL AND DISPLAY DEVICE

CROSS REFERENCE TO RELATED APPLICATIONS

This application is a national phase entry under 35 U.S.C. § 371 of International Application No. PCT/CN2021/088538, filed on Apr. 20, 2021, which claims priority of Chinese Patent Application No. 202010372676.9, filed with the China National Intellectual Property Administration (CNIPA) on May 6, 2020, and entitled "DISPLAY PANEL AND DISPLAY DEVICE", the entire content of which is incorporated herein by reference.

FIELD

The present disclosure relates to the technical field of display, in particular to a display panel and a display device.

BACKGROUND

At present, in a display panel, an end, provided with a pad region, of a TFT (thin film transistor) array substrate exceeds a CF (color filter) substrate. That is, the TFT array substrate and the CF substrate are arranged in a misaligned mode. The pad region is provided with a panel-driven gold finger. A COF (chip on flex or chip on film), FPC and the like are attached to a surface of the gold finger.

SUMMARY

Embodiments of the present disclosure provide a display panel, including:

a display substrate, wherein at least one side of the display substrate is provided with a pad region, a plurality of gold fingers are arranged in the pad region, and the gold fingers extend to a side edge of the display substrate where the pad region is located;

an opposing substrate, wherein the opposing substrate is arranged opposite to the display substrate, and an orthographic projection of the opposing substrate on the display substrate covers the pad region;

frame sealant, wherein the frame sealant seals an area between the display substrate and the opposing substrate, and the pad region is located on an outer side of the area sealed by the frame sealant;

a flexible buffer layer, wherein the flexible buffer layer is filled between the display substrate and the opposing substrate and is located on the outer side of the area sealed by the frame sealant, and an orthographic projection of the flexible buffer layer on the display substrate covers the gold fingers; and a conductive part, wherein the conductive part is located on a side face of the display substrate close to the pad region, and the conductive part is electrically connected with the gold fingers.

In the display panel provided by some embodiments of the present disclosure, the orthographic projection of the flexible buffer layer on the display substrate only covers the pad region.

In the display panel provided by some embodiments of the present disclosure, the flexible buffer layer is arranged around the frame sealant.

In the display panel provided by some embodiments of the present disclosure, the flexible buffer layer includes an organic film layer.

In the display panel provided by some embodiments of the present disclosure, a material of the organic film layer includes acrylic acid.

In the display panel provided by some embodiments of the present disclosure, the flexible buffer layer includes a color resistance material or a resin material.

According to the display panel provided by some embodiments of the present disclosure, the display panel further includes an insulating layer between the flexible buffer layer and the gold fingers.

In the display panel provided by some embodiments of the present disclosure, a gap exists between the flexible buffer layer and the frame sealant.

In the display panel provided by some embodiments of the present disclosure, at least part of the gold fingers each includes a first electrode part of a source drain metal layer on the display substrate, a second electrode part of a gate electrode layer on the display substrate, and a pad part of a transparent electrode layer on the display substrate. In the same one gold finger, the first electrode part and the second electrode part are electrically connected through the pad part.

In the display panel provided by some embodiments of the present disclosure, the conductive part includes conductive silver glue in one-to-one corresponding contact with side faces of the gold fingers, and an anisotropic conductive film located on one side of the conductive silver glue away from the gold fingers.

In some embodiments, the conductive silver glue is in contact with and fixed with the opposing substrate, the flexible buffer layer and the display substrate.

The anisotropic conductive film covers each piece of the conductive silver glue and is larger than the conductive silver glue.

Embodiments of the present disclosure further provide a display device. The display device includes any display panel provided in the above technical solution and a chip on film at least partially located on one side face of the display panel close to the pad region; and the chip on film is electrically connected with gold fingers through the conductive part in the display panel.

DETAILED DESCRIPTION OF THE EMBODIMENTS

Although a current display panel can realize a display function, it is not conducive to realization of an ultra narrow frame of a display device. Therefore, with the increasing demand for a display device with an ultra narrow frame, it is urgent to design a display panel which is conducive to the realization of the ultra narrow frame and may realize stable electrical connection.

The technical solutions in embodiments of the present disclosure will be clearly and completely described below in combination with the accompanying drawings in the embodiments of the present disclosure. Obviously, the described embodiments are only part of the embodiments of the present disclosure, not all of the embodiments. Based on the embodiments in the present disclosure, all other embodiments obtained by those skilled in the art without making creative work belong to the scope of protection of the present disclosure.

Figure 1:
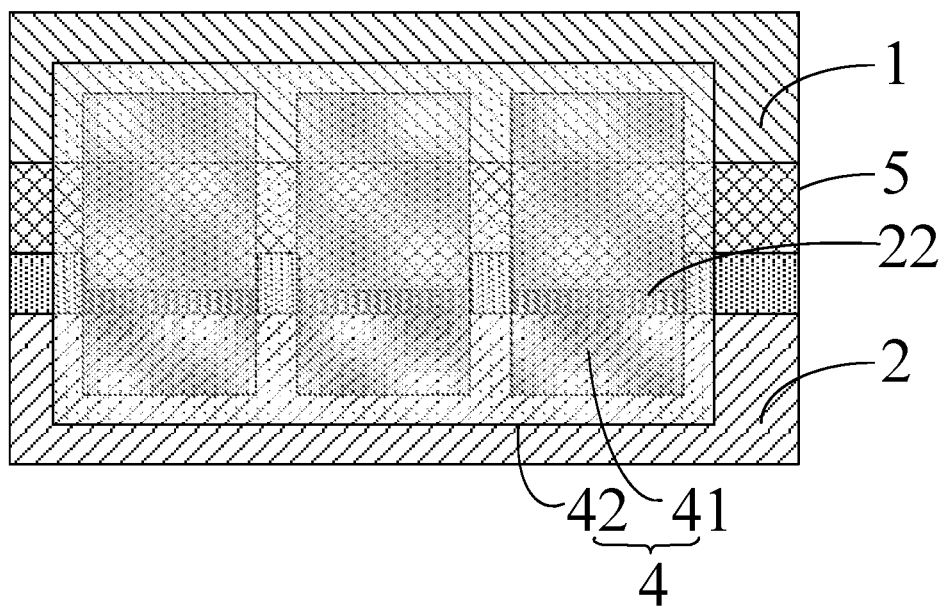
FIG. 1 is a side view of a display panel provided by an embodiment of the present disclosure.
Figure 2:
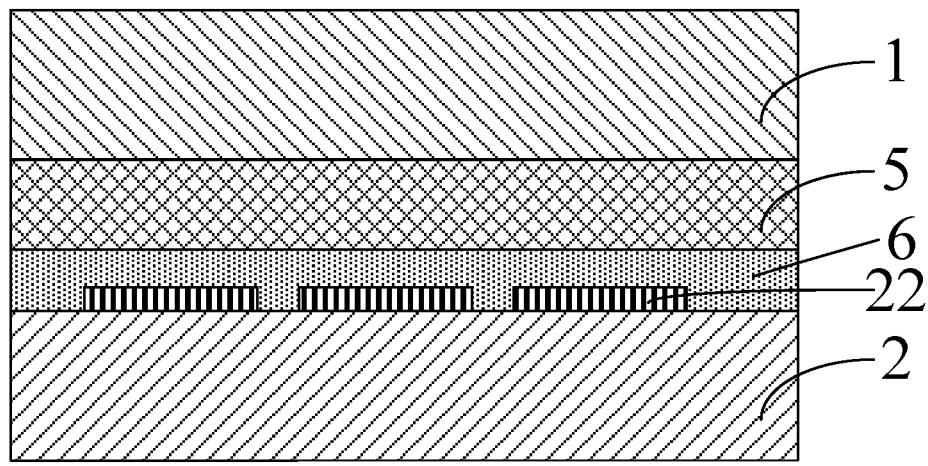
FIG. 2 is a side view of another display panel provided by an embodiment of the present disclosure (a conductive part is not shown).
Figure 3:
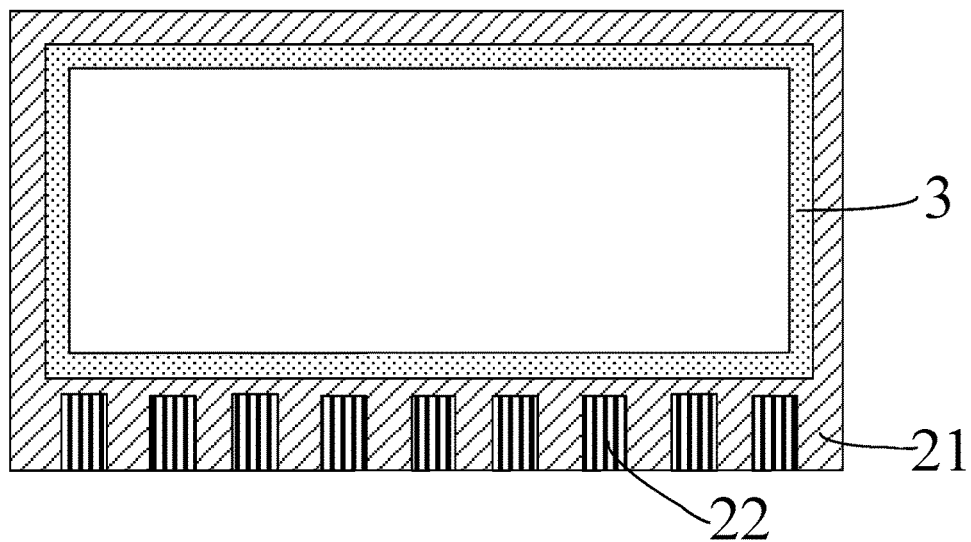
FIG. 3 is a top view of a display panel provided by an embodiment of the present disclosure (an opposing substrate and a flexible buffer layer are not shown).

As shown in FIG. 1 to FIG. 3, embodiments of the present disclosure provide a display panel. The display panel includes a display substrate 2, an opposing substrate 1, frame sealant 3, a flexible buffer layer 5, and a conductive part 4.

At least one side of the display substrate 2 has a pad region 21. A plurality of gold fingers 22 are arranged in the pad region 21. Each gold finger 22 extends to a side edge of the display substrate 2 where the pad area 21 is located.

The opposing substrate 1 is arranged opposite to the display substrate 2. An orthographic projection of the opposing substrate 1 on the display substrate 2 covers the pad region 21.

The frame sealant 3 seals an area between the display substrate 2 and the opposing substrate 1. The pad area 21 is located on an outer side of the area sealed by the frame sealant 3.

The flexible buffer layer 5 is filled between the display substrate 2 and the opposing substrate 1 and is located on the outer side of the area sealed by the frame sealant 3. An orthographic projection of the flexible buffer layer 5 on the display substrate 2 covers the gold fingers 22.

The conductive part 4 is located on a side face of the display substrate 2 close to the pad area 21. The conductive part 4 is electrically connected with the gold fingers 22.

In the display panel provided by embodiments of the present disclosure: at least one side of the display substrate 2 has the pad area 21; the orthographic projection of the opposing substrate 1 on the display substrate 2 covers the pad area 21; a side face of each gold finger 22 in the pad area 21 is exposed to a side face of the display substrate 2; and the side faces of the gold fingers 22 are electrically connected with the conductive part 4 located on the side face of the display substrate 2. Therefore one end of the display substrate 2 provided with the pad area does not need to exceed the opposing substrate 1, which is conducive to realizing an ultra narrow frame of a display device. Further, the flexible buffer layer 5 is filled between the opposing substrate 1 and the display substrate 2 outside the frame sealant 3. Each gold finger 22 is protected by the flexible buffer layer 5. In a process of cutting and grinding the display substrate 2, the flexible buffer layer 5 can play a buffer role, so as to effectively reduce possibility of side face damage of each gold finger 22, improve subsequent yield of attaching a COF on a side face of the display panel, and realize stable electrical connection of the display panel.

In some embodiments, for realizing a protective effect of the flexible buffer layer 5 on the gold fingers 22, as shown in FIG. 1, the flexible buffer layer 5 may be in direct contact with the gold fingers 22, so as to realize direct coverage protection of the gold fingers 22 by the flexible buffer layer 5.

Alternatively, in some embodiments, in order to achieve better electrically insulating protection for the gold fingers 22, as shown in FIG. 2, an insulating layer 6 may be set between the flexible buffer layer 5 and the gold fingers 22. For example, the insulating layer 6 is made of inorganic insulating materials such as SiN. Each gold finger 22 is covered with the insulating layer 6, and the flexible buffer layer 5 covers the insulating layer 6, so that the flexible buffer layer 5 indirectly covers the gold fingers 22 for protection.

In some embodiments, the insulating layer 6 may be made by setting patterns corresponding to the pad area 21 for an existing insulating layer in the display substrate 2, so as to save a manufacturing process.

In some embodiments, in order to facilitate fabrication and save materials, the orthographic projection of the flexible buffer layer 5 on the display substrate 2 may cover only the pad area 21. That is, the flexible buffer layer 5 is only arranged at a frame edge on one side of the display panel with the pad area 21.

Alternatively, in some embodiments, in order to make sure uniformity of pressure at each frame edge of the display panel, the flexible buffer layer 5 may be arranged around the frame sealant 3. That is, the flexible buffer layer 5 is arranged around the frame sealant 3 by a circle.

In some embodiments, in order to prevent poor display and the like, a certain gap exists between the flexible buffer layer 5 and the frame sealant 3. That is, the orthographic projection of the flexible buffer layer 5 and an orthographic projection of the frame sealant 3 on the display substrate 2 do not overlap each other.

In some embodiments, the flexible buffer layer 5 may include an organic film layer. For example, the flexible buffer layer 5 may be an organic film layer formed of acrylic acid (for example, conventional acrylic acid or hydrophobic acrylic acid).

In an implementation, the flexible buffer layer 5 may also be formed of a color resistance material.

In an implementation, the flexible buffer layer 5 may also be formed of a resin material, such as an OC (over coat) material.

Figure 4:
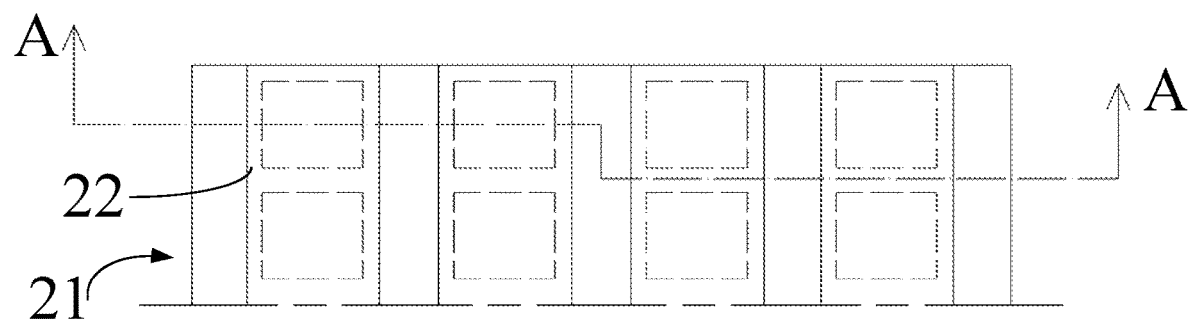
FIG. 4 is a partial schematic structural diagram of a display panel provided by an embodiment of the present disclosure.
Figure 5:
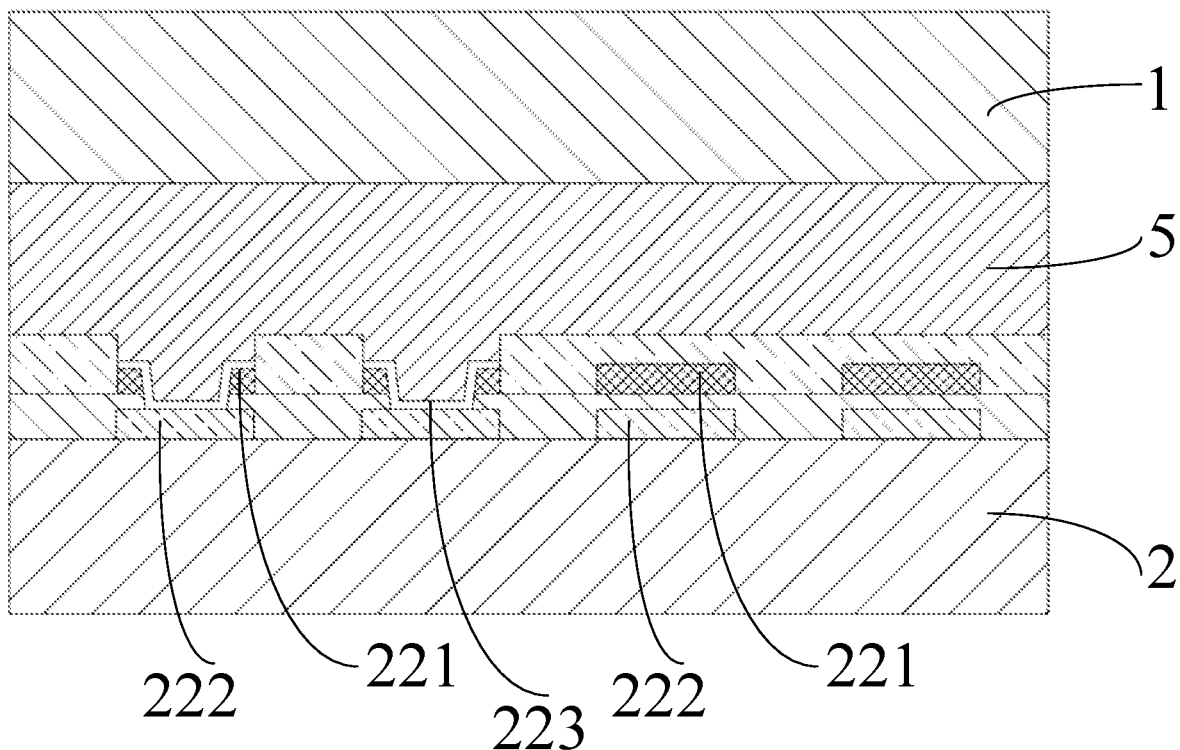
FIG. 5 is a sectional view along line A-A in FIG. 4.

In some embodiments, in order to enhance reliability of an electrical connection between the gold fingers 22 and an external circuit, as shown in FIG. 4 and FIG. 5, at least part of the gold fingers 22 may include a first electrode part 221 of a source drain metal layer (SD layer) on the display substrate 2, a second electrode part 222 of a gate electrode layer (gate layer) on the display substrate 2, and a pad part 223 of a transparent electrode layer (ITO) on the display substrate 2. The first electrode part 221 and the second electrode part 222 belonging to the same gold finger 22 are electrically connected through the corresponding pad part 223, so that an area of the side face of the gold finger 22 may be increased, which is conducive to the electrical connection with the external circuit through the conductive part 4.

In some embodiments, the conductive part 4 may include conductive silver glue 41 in one-to-one corresponding contact with the side faces of the gold fingers 22, and an anisotropic conductive film (ACF) 42 located on one side of the conductive silver glue 41 away from the gold fingers 22. Pieces of the conductive silver glue 41 in contact with different gold fingers 22 are generally independent of each other, and the anisotropic conductive film 42 may be arranged as a whole film.

In some embodiments, in order to increase the reliability of connecting with the external circuit through the conductive part 4, the conductive silver glue 41 may be in contact with and fixed with the opposing substrate 1, the flexible buffer layer 5 and the display substrate 2. The anisotropic conductive film 42 covers each piece of conductive silver glue 41 and is larger than the conductive silver glue 41. It can be considered that the conductive silver glue 41 and the anisotropic conductive film 42 are pasted on side faces of the opposing substrate 1, the flexible buffer layer 5 and the display substrate 2 to increase a fixed contact area and improve a fixing firmness.

Figure 6:
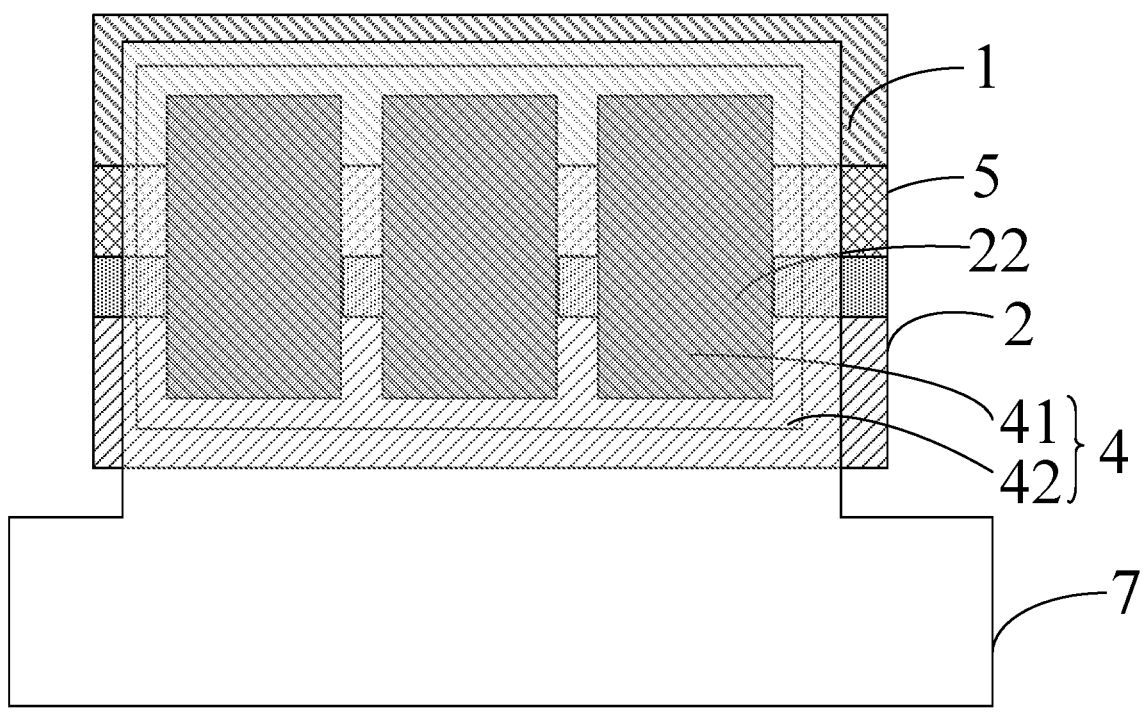
FIG. 6 is a side view of a display device provided by an embodiment of the present disclosure.

Based on the same inventive concept, embodiments of the present disclosure further provide a display device. As shown in FIG. 6, the display device includes any display panel provided in the above embodiments, so the display device can achieve at least a beneficial effect that the display panel can achieve. That is, it is conducive to realizing an ultra narrow frame of the display device. Moreover, the possibility of damage of side faces of the gold fingers 22 is effectively reduced, a yield of lateral attachment of the display panel is improved, and a stable electrical connection of the display panel is realized. The display device further includes a chip on film 7. The chip on film 7 at least partially located on a side face of the display panel close to the pad area 21. The rest part of the chip on film 7 is bent to a back of the display panel. The chip on film 7 is electrically connected with the gold fingers 22 through the conductive part 4 in the display panel.

A process flow of a lateral attachment technology of the above display device provided by the embodiments of the present disclosure can be as follows.

After preparing the display panel, conductive silver glue is applied on side faces of the gold fingers 22.

An anisotropic conductive film is coated on a surface of the conductive silver glue.

A COF is attached to a surface of the anisotropic conductive film.

Obviously, those skilled in the art can make various modifications and variants to the present disclosure without departing from the spirit and scope of the present disclosure. Thus, if these modifications and variants of the present disclosure fall within the scope of the claims of the present disclosure and their equivalents, the present disclosure is also intended to include these modifications and variants.

What is claimed is:

1. A display panel, comprising:
a display substrate, wherein at least one side of the display substrate is provided with a pad region, a plurality of gold fingers are arranged in the pad region, and the gold fingers extend to a side edge of the display substrate where the pad region is located;
an opposing substrate, wherein the opposing substrate is arranged opposite to the display substrate, and an orthographic projection of the opposing substrate on the display substrate covers the pad region;
frame sealant, wherein the frame sealant seals an area between the display substrate and the opposing substrate, and the pad region is located on an outer side of the area sealed by the frame sealant;
a flexible buffer layer, wherein the flexible buffer layer is filled between the display substrate and the opposing substrate and is located on the outer side of the area sealed by the frame sealant, and an orthographic projection of the flexible buffer layer on the display substrate covers the gold fingers; and
a conductive part, wherein the conductive part is located on a side face of the display substrate close to the pad region, and the conductive part is electrically connected with the gold fingers.

2. The display panel according to claim 1, wherein the orthographic projection of the flexible buffer layer on the display substrate only covers the pad region.

3. The display panel according to claim 1, wherein the flexible buffer layer is arranged around the frame sealant.

4. The display panel according to claim 1, wherein the flexible buffer layer comprises an organic film layer.

5. The display panel according to claim 4, wherein a material of the organic film layer comprises acrylic acid.

6. The display panel according to claim 1, wherein the flexible buffer layer comprises a color resistance material or a resin material.

7. The display panel according to claim 1, further comprising: an insulating layer between the flexible buffer layer and the gold fingers.

8. The display panel according to claim 1, wherein a gap exists between the flexible buffer layer and the frame sealant.

9. The display panel according to claim 1, wherein each of at least part of the gold fingers comprises:
a first electrode part of a source drain metal layer on the display substrate;
a second electrode part of a gate electrode layer on the display substrate; and
a pad part of a transparent electrode layer on the display substrate;
wherein, in the each gold finger, the first electrode part and the second electrode part are electrically connected through the pad part.

10. The display panel according to claim 1, wherein the conductive part comprises:
conductive silver glue in one-to-one corresponding contact with side faces of the gold fingers; and
an anisotropic conductive film located on one side of the conductive silver glue away from the gold fingers.

11. The display panel according to claim 10, wherein the conductive silver glue is in contact with and fixed with the opposing substrate, the flexible buffer layer and the display substrate.

12. A display device, comprising a display panel and a chip on film, wherein:
the display panel comprises:
a display substrate, wherein at least one side of the display substrate is provided with a pad region, a plurality of gold fingers are arranged in the pad region, and the gold fingers extend to a side edge of the display substrate where the pad region is located;
an opposing substrate, wherein the opposing substrate is arranged opposite to the display substrate, and an orthographic projection of the opposing substrate on the display substrate covers the pad region;
frame sealant, wherein the frame sealant seals an area between the display substrate and the opposing substrate, and the pad region is located on an outer side of the area sealed by the frame sealant;
a flexible buffer layer, wherein the flexible buffer layer is filled between the display substrate and the opposing substrate and is located on the outer side of the area sealed by the frame sealant, and an orthographic projection of the flexible buffer layer on the display substrate covers the gold fingers; and
a conductive part, wherein the conductive part is located on a side face of the display substrate close to the pad region, and the conductive part is electrically connected with the gold fingers;
wherein the chip on film at least partially located on the side face of the display panel close to the pad region, and the chip on film is electrically connected with the gold fingers through the conductive part in the display panel.

13. The display panel according to claim 10, wherein the anisotropic conductive film covers each piece of the conductive silver glue and is larger than the conductive silver glue.

14. The display device according to claim 12, wherein the orthographic projection of the flexible buffer layer on the display substrate only covers the pad region.

15. The display device according to claim 12, wherein the display panel further comprises: an insulating layer between the flexible buffer layer and the gold fingers.

16. The display device according to claim 12, wherein a gap exists between the flexible buffer layer and the frame sealant.

17. The display device according to claim 12, wherein each of at least part of the gold fingers comprises:
   a first electrode part of a source drain metal layer on the display substrate;
   a second electrode part of a gate electrode layer on the display substrate; and
   a pad part of a transparent electrode layer on the display substrate;
wherein, in the each gold finger, the first electrode part and the second electrode part are electrically connected through the pad part.

18. The display device according to claim 12, wherein the conductive part comprises:
   conductive silver glue in one-to-one corresponding contact with side faces of the gold fingers; and
   an anisotropic conductive film located on one side of the conductive silver glue away from the gold fingers.

19. The display device according to claim 18, wherein the conductive silver glue is in contact with and fixed with the opposing substrate, the flexible buffer layer and the display substrate.

20. The display device according to claim 18, wherein the anisotropic conductive film covers each piece of the conductive silver glue and is larger than the conductive silver glue.

* * * * *